United States Patent [19]

Ishikawa

[11] Patent Number: 5,243,576
[45] Date of Patent: Sep. 7, 1993

[54] SEMICONDUCTOR MEMORY DEVICE
[75] Inventor: Toru Ishikawa, Tokyo, Japan
[73] Assignee: Nec Corporation, Tokyo, Japan
[21] Appl. No.: 752,142
[22] Filed: Aug. 29, 1991
[30] Foreign Application Priority Data Aug. 30, 1990 [JP] Japan .................................. 2-229993

[51] Int. Cl.[5] .............................................. G11C 7/00
[52] U.S. Cl. ..................................... 365/222; 365/236
[58] Field of Search ................. 365/222, 236; 364/200

[56] References Cited

U.S. PATENT DOCUMENTS

| | | | |
|---|---|---|---|
| 4,631,701 | 12/1986 | Kappeler et al. | 365/222 |
| 4,758,992 | 7/1990 | Taguchi | 365/222 |
| 4,935,900 | 6/1990 | Ohsawa | 365/222 |
| 4,939,695 | 6/1990 | Isobe et al. | 365/222 |
| 4,984,210 | 1/1991 | Kumanoya et al. | 365/222 |

FOREIGN PATENT DOCUMENTS 0222091 10/1986 Japan .................................. 365/222
0083893 3/1990 Japan .................................. 365/222

Primary Examiner—Eugene R. LaRoche
Assistant Examiner—Vu Le
Attorney, Agent, or Firm—Sughrue, Mion, Zinn, Macpeak & Seas

[57] ABSTRACT

A semiconductor memory device is capable of holding stored contents of dynamic memory cells effectively through a refresh operation. The memory device has a frequency-divider circuit, a refresh control circuit for generating a word line activation signal in response to an output of the frequency-divider circuit and a control circuit for controlling a frequency division value of the frequency-divider circuit.

10 Claims, 5 Drawing Sheets

SEMICONDUCTOR MEMORY DEVICE

BACKGROUND OF THE INVENTION

1. Field of the Invention

This invention relates to a semiconductor memory device, and more particularly to a refresh circuit for a dynamic random access memory (DRAM).

2. Description of the Prior Art

Each element of a memory cell array in DRAM, which is a memory cell, includes a charge-storage capacitor element and a MOS FET controlling input into and output from the capacitor element. The stored information is represented by the charge stored in the capacitor element. This charge will decay over time due to leakage current of MOS FET and the recombination on the surface of the semiconductor substrate. It therefore requires a process of refreshing periodically the stored information.

For accomplishing this refresh process at a high efficiency a number of refresh modes, have been utilized for example, the CAS before RAS refresh (CBR) mode in which refreshing is started by changing timings of external address signals CAS and RAS from those in the usual mode, and self-refresh mode in which, upon exceeding a predetermined wait time of the memory, all the memory cells are automatically refreshed at regular time intervals. In addition to these refresh modes, there is a kind of refresh process associated with read/write operation. In this operation, all memory cells connected to a selected word line supply the respective stored-contents to the associated bit lines connected to them, and the electric potentials of these bit lines are amplified by the sense amplifiers and restored as refreshed contents in the respective memory cells.

In such semiconductor memory devices, for the purpose of speed of operations, such as read/write operation except self-refresh mode, and refreshing in CBR mode, pulses of a relatively short active level duration (or pulse width) have been placed on the selected word line.

This method however may result in an insufficient stored charge quantity in the capacitor element of the memory cell. For example, the active level can not be maintained past the time point when the potential difference (restore level) between both terminals of the capacitor, which reflects its charge quantity, has reached as small as about 80% of the electric potential of the bit lines. In self-refresh mode, pulses of a relatively-long HIGH level duration are placed on a selected word line, and consequently the capacitor element of each memory cell is sufficiently charged with effects of going to relatively high restore level. This increases the duration of holding the data stored in the capacitor element, and accordingly permits refreshing at longer time intervals. By refreshing associated with regular read/write operations, a data-hold duration directly after this, is relatively short, and the time intervals of refreshing must be correspondingly short.

On the other hand, for example, when switched, directly after read or write operation has been completed, to the above-mentioned self-refresh mode, each memory cell holds the store data at the same low restore level as performed during the read/write operation. When such a situation remains, the read and write operation has been completed, and directly after this the switch to the above-mentioned self-refresh mode is performed. In such case it takes the same long time untill the first refreshing as in self-refresh mode where the data is stored at a high restore level in the memory cell, and within this time the charge stored in the capacitor element of the memory cell may decay away to an undetectable extent, probably resulting in producing an error in the storage contents.

BRIEF SUMMARY OF THE INVENTION

Objects of the Invention

It therefore is the principal object of the present invention to provide a semiconductor memory device capable of preventing the stored contents of the memory cells from decaying away particularly in the case of switching directly after regular refreshing associated with a read/write or other operation to a self-refresh mode.

SUMMARY OF THE INVENTION

A semiconductor memory device according to the present invention comprises a frequency divider circuit for selectively dividing clock pulses in accordance with frequency-division control pulses; a frequency-division controller circuit for, upon reaching a specified count while counting the clock pulses in response to an control pulse input, changing frequency-division control pulses; refresh-address generating means for generating refresh addresses in response to the outputs of the frequency divider circuit; a refresh control circuit for generating word-line activating pulses in response to outputs of the frequency-divider circuit and the control pulse; a memory cell array unit including an array consisting of plurality of memory cells and the bit and word lines each connected to a row or column of memory cells; and decode means for selecting in accordance with a refresh address the specified word line, and activating this selected word line in response to a word line activating signal.

It is preferred that the frequency divider circuit comprises division means including a plurality of flip-flops and means for controlling the outputs of the frequency divider circuit in accordance with the frequency-division control pulses.

It is preferred that the frequency-division controller circuit comprises counting means for, upon reaching a specified count while counting the clock pulses in response to the control pulse, generating a detection pulse; and control means for changing the frequency-division control pulses in response to the detection pulse.

BRIEF DESCRIPTION OF THE DRAWINGS

The above-mentioned and other objects, features and advantages of this invention will become more apparent by reference to the following detailed description of the invention taken in conjunction with the accompanying drawings, wherein.

DETAILED DESCRIPTION OF THE INVENTION

Figure 1:
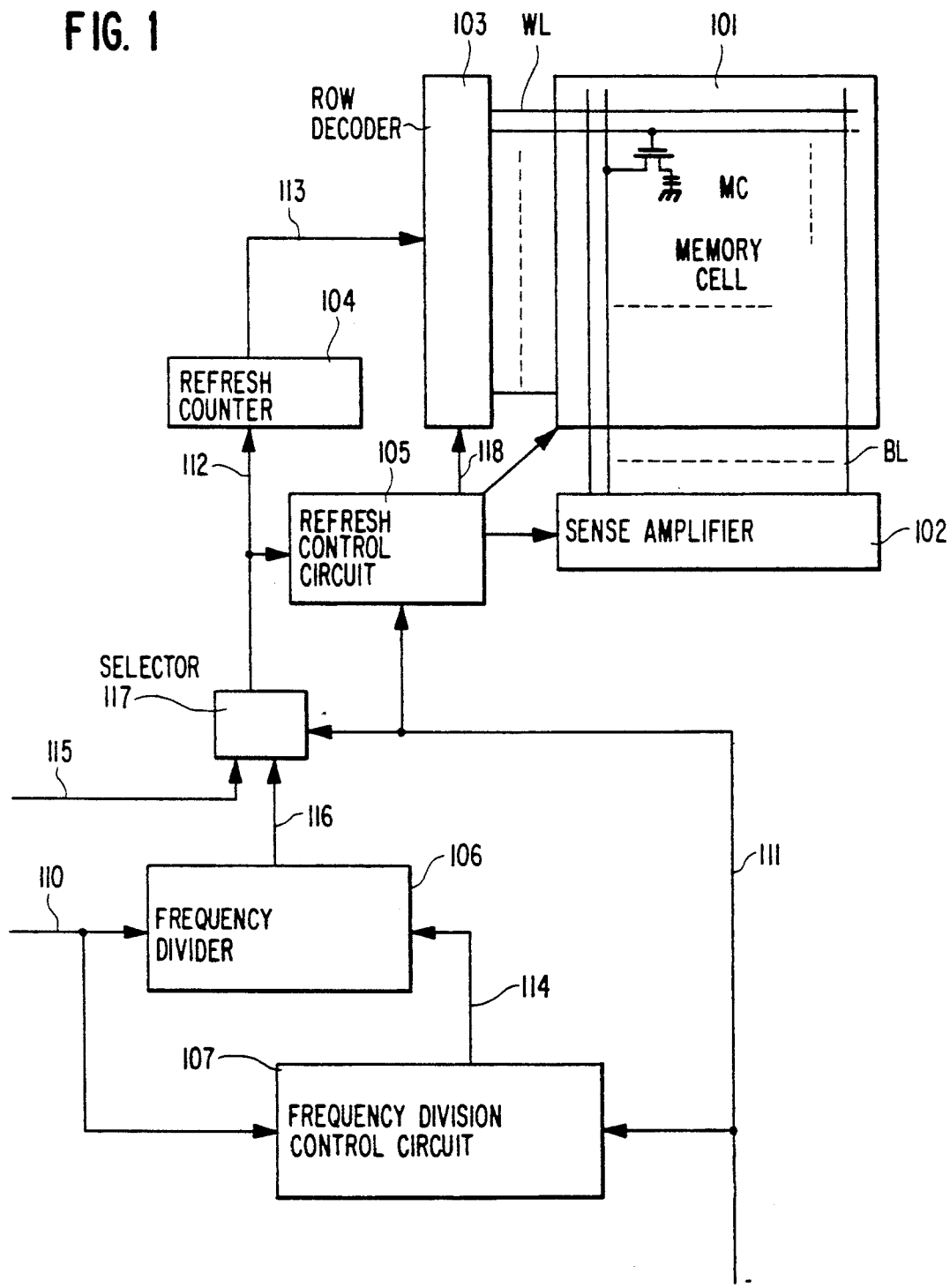
FIG. 1 is a block circuit diagram illustrating the configuration of a semiconductor memory device embodying the present invention.

Referring to FIG. 1, in which a reference character 101 designates a memory cell array of which each element is the so-called one-transistor/one-capacitor memory cell (MC) consisting of a n-channel transistor and a capacitor element. A bit line BL is connected to a sense amplifier 102 which amplifies the electric potential of the bit line BL. A row decoder 103 selects one word line WL in accordance with an input row address 113, and moves its potential to HIGH level in response to a word-line activating signal 118 from a refresh control circuit 105.

Frequency divider circuit 106 receives an external or internally-generated standard clock pulse 110 and generates a frequency divider output pulse 116 of either frequency, in this embodiment, ¼ of or the same as the frequency of clock pulse 110 according to whether frequency-division control pulse 114 has HIGH or LOW level.

A frequency-division controller circuit 107 which receives a control pulse 111 which is held at LOW level in the self-refresh mode, and a clock pulse 110, responds to control pulse 111 at HIGH level by changing frequency control pulse 114 to HIGH level. It also responds to control pulse 111 by changing frequency-division control pulse 114 to LOW level, and at this time point the counting of generated clock pulses 110 beginning, and upon reaching a specified number (in this embodiment the same number as that of word lines WL) of them, changes the frequency-division control pulse 114 back to HIGH level.

A selector 117 selects a frequency divider output a clock pulse 116 or a R/W refresh pulse 115 in accordance with a control pulse 111, and supplies the selected pulse as a refresh pulse 112 to a refresh counter 104 and a refresh control circuit 105.

A refresh counter 104 provides refresh addresses 113 to a row decoder 103 in accordance with the refresh pulses 112. The refresh control circuit 105 outputs word line activating signals 118 to the row decoder 103, control signals to the memory cell array 101 (particularly a precharge circuit, and others) and control pulses to the sense amplifier 102 in accordance with control pulses 111 and refresh pulses 112. This circuit sets a word line activating pulse 118 to either relatively short or long duration of HIGH level according to whether control pulse 111 is of HIGH or LOW.

In association with a read/write or other operation, the regular refresh mode is switched to the self-fresh mode, and the control pulse 111 goes to LOW level. From this time point to the time point when all the word lines become a HIGH level or when all the memory cells have been refreshed once, the refresh pulses 112 having the same period as that of the clock pulse 110 are generated, thus short period refreshing is repeated.

In the following, referring to FIG. 2, the combined configuration of a frequency divider circuit 106 and a frequency-division controller circuit 107 will be described in detail.

The frequency divider circuit 106 comprises two D flip-flop circuits 201 and 202, a NAND gate 203 with inputs each receiving outputs 211, 212, respectively, of the flip-flop circuits, a second NAND gate 204 with inputs each receiving the frequency-division control pulse 114 from the frequency-division controller circuit 107 and output 213 of NAND gate 203, respectively, and a third NAND gate 205 with inputs each receiving a clock pulse 110 through an inverter 209 and output 214 of NAND gate 204, respectively. This configuration permits the generation of frequency divider output pulses 116 the frequency of which are either ¼ of or the same as the frequency of clock pulse 110 according to whether frequency-division control pulse 114 is of a HIGH or LOW level.

Frequency-division controller circuit 107 comprises a counter 206 which counts the clock pulses 110 while the control pulse 111 is held at LOW level, and becomes reset when control pulse 111 goes to a HIGH level; a one-shot circuit 208 for generating a one-shot pulse 217 when the control pulse 111 is held at a LOW level; and a D flip-flop circuit 207 which is reset by the one-shot pulse 217 and outputs the frequency-division control pulse 114 in accordance with detection output pulse 216 of counter 206. By virtue of this configuration, the change of the control pulse 111 to a LOW level causes the generation of the one-shot pulse 217 which resets the D flip-flop circuit 207, resulting in the change of the frequency-division control pulse 114 to a LOW level. At the same time, the counter 206 is removed from RESET, and thus at this time point, counting of the clock pulses 110 begins. Upon reaching a specified number of the clock pulses 110 generated thereafter (in this embodiment, the number of word lines WL, for example, 1024), a detection output pulse 216 goes to a HIGH level, which changes the frequency-division pulse 114 back to a HIGH level.

Figure 3:
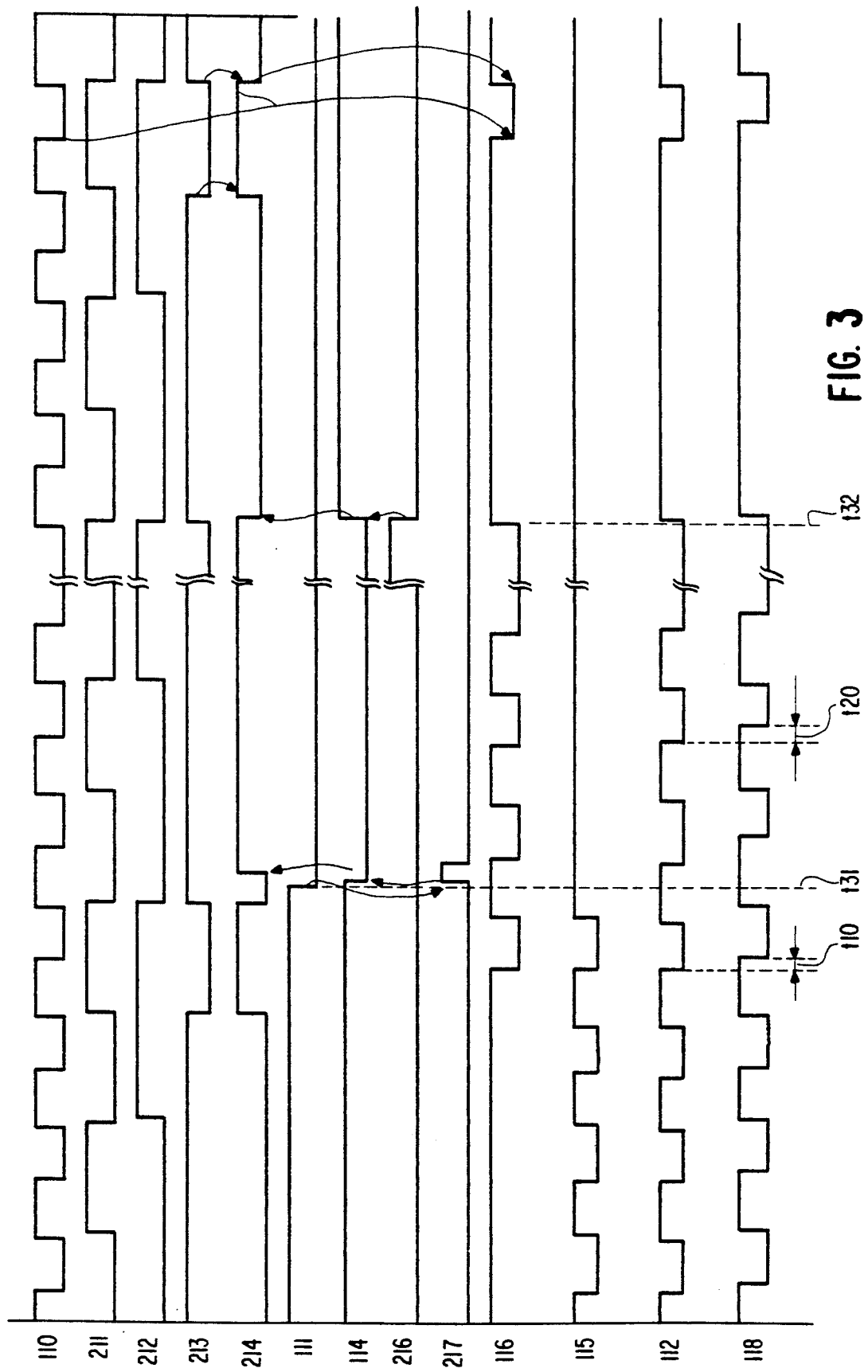
FIG. 3 is a waveform diagram for illustrating the operation of the semiconductor memory device of FIG. 1.

Referring to FIG. 3 the operation of this embodiment will a be described. Refreshing associated with read/write operation is performed in regular mode in which the control pulse 111 is forced to be held at HIGH level. In this situation, the selector 117 responds by selecting R/W refresh pulse 115 which is output therefrom as the refresh pulse 112 to the refresh counter 104 and the refresh controller circuit 105 (FIG. 1). Then the refresh counter 104 supplies address signal 113 to the row decoder 103 under the timing of R/W refresh pulse 115. Since the control pulse 111 is held at a HIGH level, the refresh control circuit 105 provides the word-line activating pulse 118 having a relatively short HIGH level duration to the row decoder 103. Thus the row decoder 103 holds the word line WL corresponding to the address signal 113 at a HIGH level while the word-line activating pulse 118 is at a HIGH level (t10 in FIG. 3), thereby refreshing is accomplished.

Directly after a read/write operation occurs the switch to the self-refresh mode is accomplished in which the control pulse 111 is forced to a go to LOW level (t31 in FIG. 3). Accordingly the counter 206 in the frequency-division controller circuit 107 is removed from RESET and counting clock pulses starts (See FIG. 2). At the same time the one-shot circuit 208 produces a one-shot pulse 217 which resets the D flip-flop circuit 207 which in turn changes the frequency-division control pulse 114 to LOW level (See FIG. 2).

The change of the frequency-division control pulse 114 to LOW level forces the output 214 of NAND gate 204 in the frequency divider circuit 106 to go to a HIGH level, and consequently the frequency-divider output pulse 116 in the form of clock pulse 110 itself, i.e., of undivided frequency, is output from the NAND gate 205.

In accordance with the control pulse 111 that is at a LOW level, the selector 117 selects frequency-divider the output pulse 116, and then supplies the refresh pulse 112 to the refresh counter 104. Under the timing of the refresh pulse 112, the refresh counter 104 provides to the row decoder 103 refresh addresses 113 which are updated at the short period of the clock pulse 110 itself. On the other hand, the refresh controller circuit 105 receives control the pulses 111 having LOW level as well, and consequently word-line activating the pulses 118 has a relatively longer HIGH level duration. In this way refreshing is repeated by a long-lasting HIGH level of word line (t20 in FIG. 3) compared with the regular refresh mode.

When all word lines WL have been supplied in sequence with a refresh pulse 112 (for this, the same number of refresh pulses 112 has been generated), and thus a refresh process for all the memory cells has completed, the count of the counter 206 counting the number of clock pulses 110 having the same period as that of the refresh pulses 112 reaches the same as the number of all word lines WL (for example 1024). Then the counter 206 changes detection pulse 216 to a HIGH level (t32 in FIG. 3). The counter 206, for example, assuming the number of word lines as 1024, may consist of a 10-bit counter, and the most significant bit (MSB) of the count may be used as a detection pulse 216. Alternatively the counter 206 which is of a binary or other type, is set to the number of word lines WL, wherein an identical signal obtained in this counter 206 may be used as the detection pulse 216.

The change of detection pulse 216 to HIGH level, particularly on the rising edge, drives the D flip-flop circuit 207 which in turn moves frequency-division control pulse 114 to HIGH level. When frequency-division control pulse 114 is at HIGH level, the change in output 214 of the NAND gate 204 which is a component of frequency circuit 106 is affected by change in the output 213 of the NAND gate 203. Consequently frequency-divider output pulse 116 changes to a signal of ¼ in frequency compared with the clock pulse 110.

Under such conditions, frequency-divider output pulse 116 changes to a ¼ frequency signal of clock pulse 110 which affects the refresh pulse 112 with change to a ¼ frequency signal. Correspondingly the refresh counter 104 generates refresh addresses 113 at prolonged time intervals, which thereafter is applied to regular self-refresh, and thus selection of word lines WL and refreshing are in sequence performed.

As described above, according to this embodiment, also in the case of switching to self-refresh mode directly after a read/write operation has finished, the first-time refreshing for all memory cells are performed at a higher restore level and at a shorter period than in regular refresh mode, which enables the stored data of the memory cell to be refreshed at a low restore level. Therefore the problem with loss of the stored data can be solved.

Figure 2:
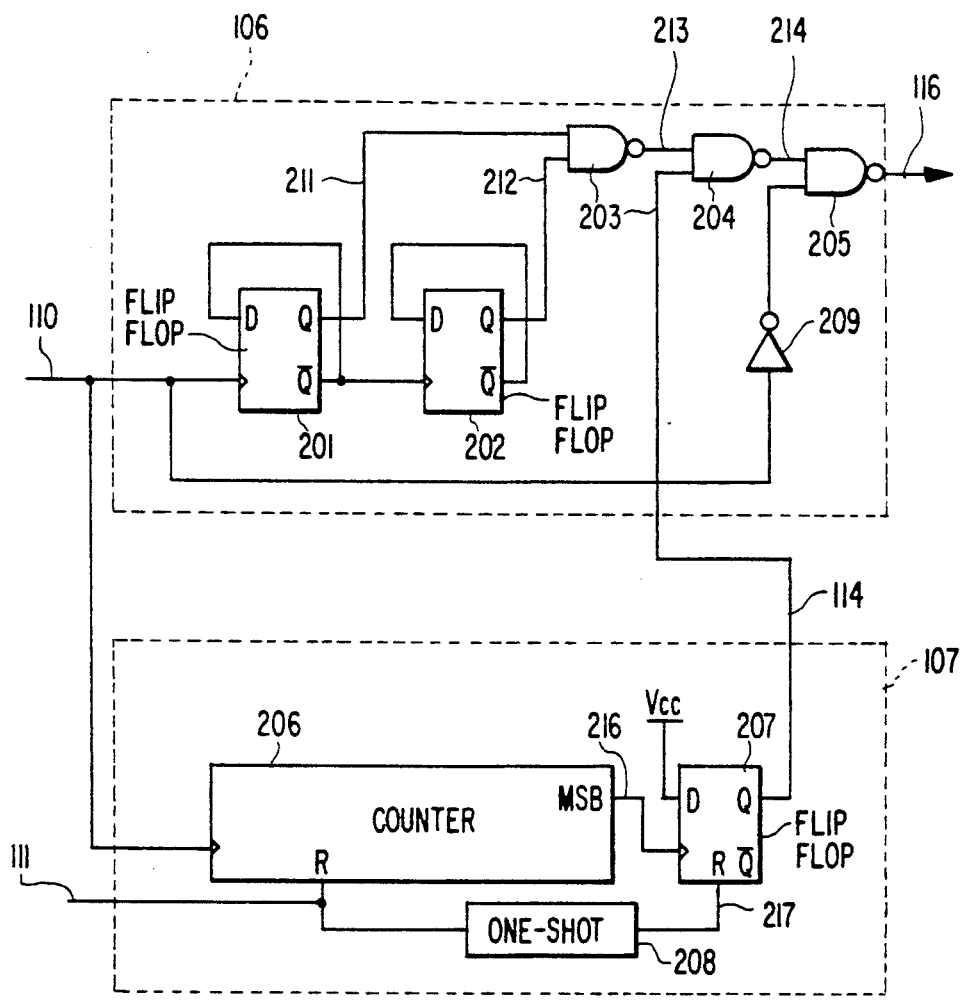
FIG. 2 is a block circuit diagram illustrating the detailed combined configuration of the frequency divider circuit and the frequency-division controller circuit in FIG. 1.
Figure 4:
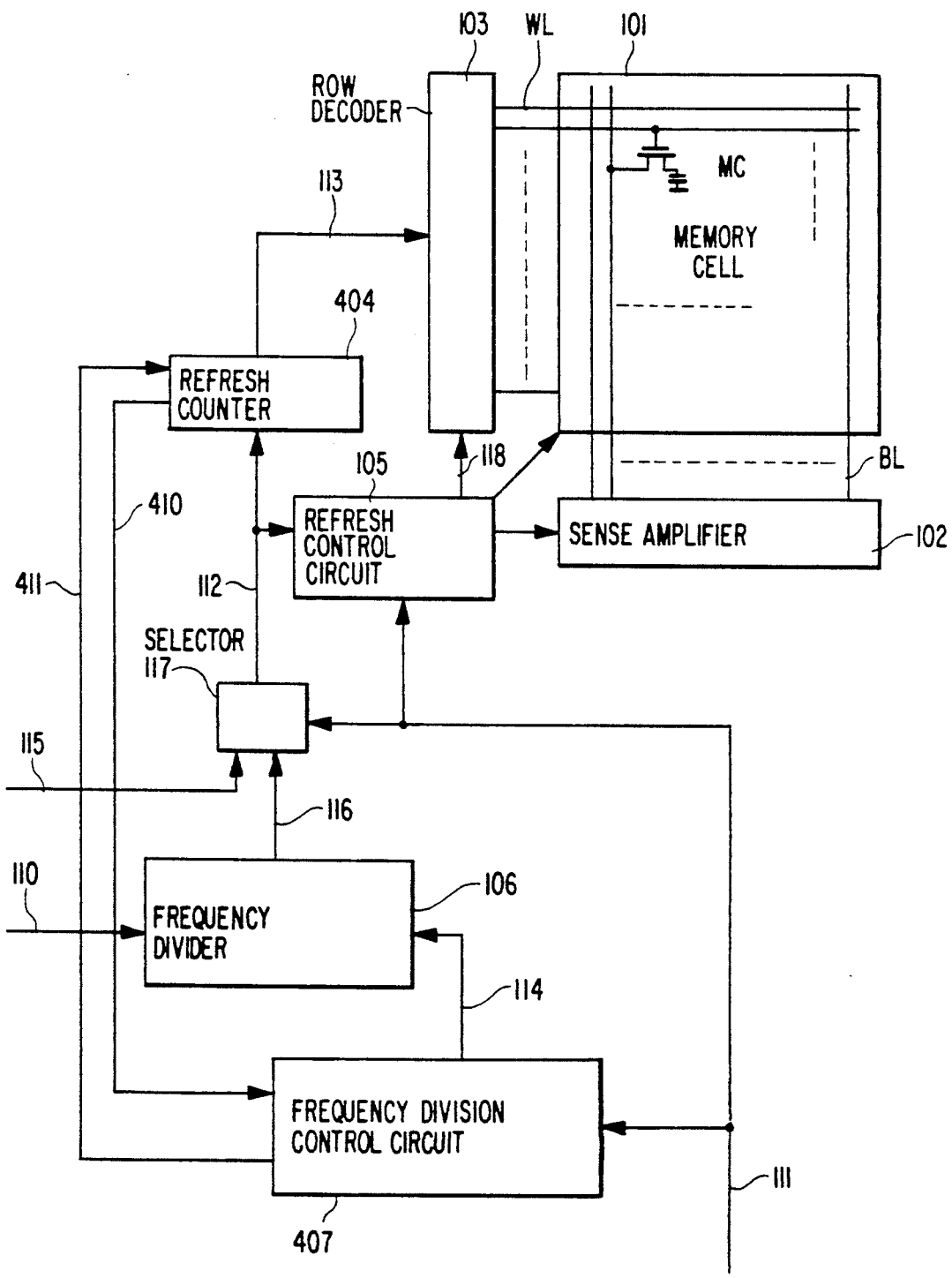
FIG. 4 is a block circuit diagram illustrating the configuration of an alternative semiconductor memory device embodying the present invention.

Referring to FIG. 4 the second embodiment of the invention will be described which is distinguished from the first embodiment, as illustrated in FIG. 2, comprising an exclusively-used counter 206 in the frequency-division controller circuit 107, in the respect that the refresh counter is used for controlling the frequency-division controller circuit, too, without necessitating any exclusively-used counter. This configuration is based on the finding by the present inventor that a common counter to counters 206 and refresh counter 104 can be used because the numbers of bits to be counted by them are equal.

In other words, the frequency-division controller circuit 407 responds to the change of the control pulse 111 to a LOW level by changing the frequency-division control pulse 114 to LOW level and generating the one-shot pulse 411. Besides it responds to the change of the detection signal 410 supplied from the refresh counter 404 to a HIGH level by changing the frequency-division control pulse 114 back to a HIGH level.

Figure 5:
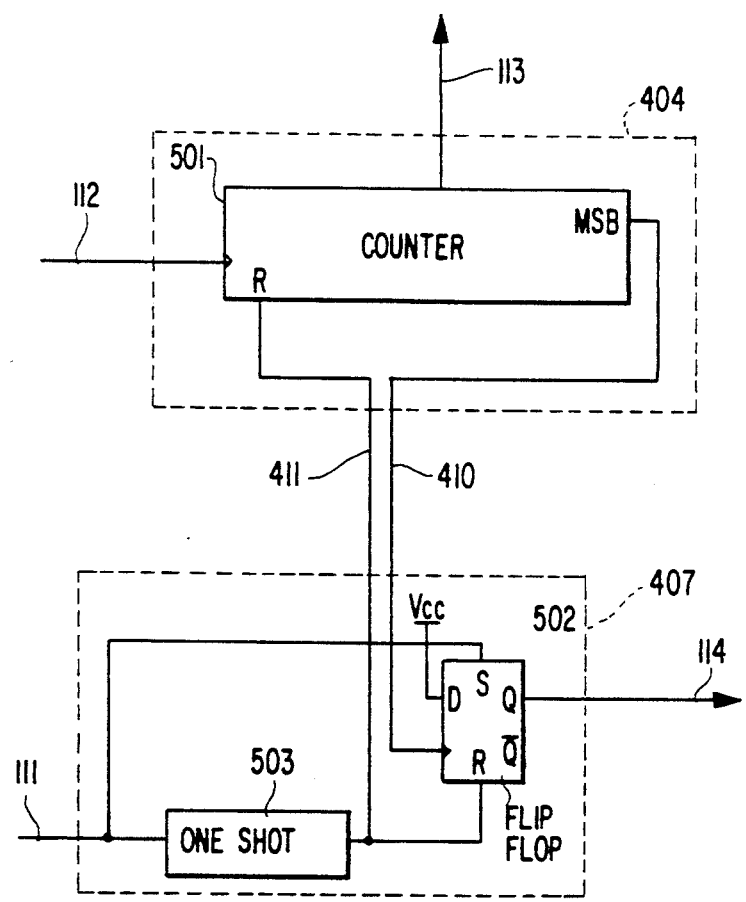
FIG. 5 is a block circuit diagram illustrating the combined configuration of the refresh counter and the frequency-division controller circuit in FIG. 4.

The refresh counter 404 consists of a counter 501 which is being reset by a one-shot pulse 411, and which counts refresh pulses 112, outputs the resulting counts as refresh addresses to the row decoder 103, and upon reaching a specified number (the same as the number of word lines WL similarly to the first embodiment) of refresh pulses 112 generated, changes the detection signal 410 to a HIGH level (See FIG. 5).

Except the parts or components described above, the configuration of the second embodiment is the same as the first embodiment described with reference to FIG. 1 and hence the detailed description of the others is omitted. The parts or components are designated by the same reference characters as are done the corresponding ones in FIG. 1.

Referring to FIG. 5, the combined configuration of the refresh counter 404 and the frequency-division controller circuit 407 will be described in detail.

The refresh counter 404 consists of a counter 501 of 10-bits, assuming the number of word lines as 1024, which is the same as the counter 206 in the frequency-divider circuit 106, and the most significant bit (MSB) of the count can be used as the detection signal 410. It may consist of a binary or other type of counter.

The frequency-division control circuit 407 consists of a one-shot circuit 503 responds to the change of control pulse 111 to LOW level by generating a one-shot pulse 411, and a D flip-flop circuit 502 which is reset by the frequency control pulse 114 and which responds to detection signal 410 from the counter 501 by outputting the frequency-division control pulse 114.

The operation of this embodiment is substantially the same as the first embodiment illustrated in FIG. 3 except for the following respects. First, the counter 206 illustrated in FIG. 3 remains reset or initialized because the control pulse 111 remains at HIGH level until the switch to self-refresh mode while in this embodiment, the counter 501 holds the count value before the switch to self-refresh mode so that one-shot pulse 411 generated in synchronism with LOW level control pulse 111 is used as a reset signal for resetting the counter 501 to initialize it. Second, when at high level, the control pulse 111 is input as a set signal to the D flip-flop circuit 502 to hold the frequency-division control pulse 114 at HIGH level.

As apparent from the above description of this embodiment, the frequency-division control circuit 407 can be configured without a counter, leading to simplification of the circuit.

In the embodiments described above a clock pulse of which frequency is ¼ of the frequency of clock pulse 110 is used as refresh pulse 112. This is not limitative and any frequency-division may be instead used.

Although the invention has been described with reference to specific embodiments, this description is not meant to be construed in a limiting sense. Various modifications of the disclosed embodiments will become apparent to persons skilled in the art upon reference to the description of the invention. It is therefore contemplated that the appended claims will cover any modifications or embodiments as fall within the true scope of the invention.

What is claimed is:

1. A semiconductor memory device comprising a frequency divider for selectively dividing clock pulses in accordance with frequency-division control pulses to output frequency-divided pulses;
   a frequency-division control circuit for, upon reaching a specified count while counting said clock pulses in response to a control pulse input, changing said frequency-division control pulses;
   refresh-address generating means for generating a refresh address each time said refresh-address generating means receives a pulse;
   a refresh control circuit for generating a word-line activating pulse each time said refresh control circuit receives a pulse;
   a memory cell array including a plurality of memory cells each connected to one of a plurality of word lines and one of a plurality of bit lines;
   decoder means for selecting one of said word lines in accordance with said refresh address and activating the selected one of said word lines in response to said word-line activating pulse; and
   a selector for, in response to said control pulse input, selecting one of said frequency-divided pulses and said refresh pulses and supplying the selected one of said frequency-divided pulses and refresh pulses to said refresh-address generating means and said refresh control circuit.

2. A semiconductor memory device according to claim 1, wherein said frequency divider circuit comprises division means including a plurality of flip-flops and means for controlling the outputs of said frequency-divider circuit in accordance with said frequency-division control pulses.

3. A semiconductor memory device according to claim 1, wherein said frequency-division controller circuit comprises counting means for, upon reaching a specified count while counting said clock pulses in response to said control pulse, generating a detection pulse; and control means for changing said frequency-division control pulses in response to said detection pulse.

4. A semiconductor memory device according to claim 1, wherein said frequency-division controller circuit comprises means for changing said frequency-division control pulse in response to a detection signal from a counter constituting said address generating means.

5. A semiconductor memory device comprising a memory cell array including a plurality of memory cells, refresh timing control means activated in a self-refresh mode for generating a refresh timing signal having a first cycle period, a refresh control circuit performing a refresh operation on said memory cells each time said first refresh timing signal is generated, and timing changing means for changing a cycle period of said refresh timing signal from said first cycle period to a second cycle period after a predetermined number of said refresh timing signals having been generated.

6. The memory device as claimed in claim 5, wherein said first cycle period is shorter than said second cycle period.

7. The memory device as claimed in claim 5, further comprising:
   receiving means for receiving a refresh pulse signal in an operation mode other than said self-refresh mode;
   and selector means coupled to said receiving means and said refresh timing control means for selecting said refresh pulse signal in an operation mode which is different from said self-refresh mode and selecting said refresh timing signal in said self-refresh mode and supplying the selected one of said refresh pulse signal and said refresh timing signal to said refresh control circuit, said refresh control circuit responding to either one of said refresh pulse signal and said refresh timing signal to perform said refresh operation on said memory cells.

8. A semiconductor memory device comprising a memory cell array including a plurality of word lines, a plurality of bit lines and a plurality of memory cells each coupled to one of said word lines and one of said bit lines, means receiving a control signal, said semiconductor memory device being brought into a self-refresh mode by said receiving means in response to an active level of said control signal, a refresh control circuit activating at least one of said word lines to perform a refresh operation on said memory cells each time a refresh timing signal is supplied thereto, a timing circuit responding to said active level of said control signal to generate a refresh timing pulse at a first cycle period, supplying means for supplying said refresh timing pulse to said refresh control circuit as said refresh timing signal, and means for causing said timing circuit to change a cycle period of said timing pulse from said first cycle period to a second cycle period after all of said word lines are activated to refresh all of said memory cells, said first cycle period being different from said second cycle period.

9. The memory device as claimed in claim 8, wherein said first cycle period is shorter than said second cycle period.

10. The memory device as claimed in claim 9, said supplying means comprises:
    receiving means for receiving a refresh control pulse; and
    a selector coupled to said refresh control pulse receiving means and said timing circuit for selecting and supplying said timing pulse to said refresh control circuit as said refresh timing signal when said control signal is at said active level and selecting and supplying said refresh control pulse to said refresh control circuit as said refresh timing signal when said control signal is at an inactive level.

* * * * *